(12) United States Patent
Chang et al.

(10) Patent No.: US 9,395,698 B2
(45) Date of Patent: Jul. 19, 2016

(54) BANG-BANG TIME TO DIGITAL CONVERTER SYSTEMS AND METHODS

(71) Applicant: Intel Corporation, Santa Clara, CA (US)

(72) Inventors: Tsung-Yuan Tony Chang, Chandler, AZ (US); Tseng-Yeng Robin Lo, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/513,348

(22) Filed: Oct. 14, 2014

(65) Prior Publication Data

US 2016/0103423 A1    Apr. 14, 2016

(51) Int. Cl.
| | | |
|---|---|---|
| *G04F 10/00* | (2006.01) |
| *H03K 5/135* | (2006.01) |
| *H03M 1/12* | (2006.01) |
| *H03K 3/356* | (2006.01) |
| *H03L 7/08* | (2006.01) |
| *H03L 7/093* | (2006.01) |
| *H03L 7/089* | (2006.01) |

(52) U.S. Cl.
CPC ............. *G04F 10/005* (2013.01); *H03K 3/356* (2013.01); *H03K 5/135* (2013.01); *H03L 7/08* (2013.01); *H03L 7/089* (2013.01); *H03L 7/093* (2013.01); *H03M 1/124* (2013.01)

(58) Field of Classification Search
CPC ................................ H03M 1/124; G06F 17/50
USPC ................. 341/118, 155, 122; 327/212, 393; 716/5, 6
See application file for complete search history.

(56) References Cited

U.S. PATENT DOCUMENTS

| | | | | |
|---|---|---|---|---|
| 5,793,227 A | * | 8/1998 | Goldrian | G06F 13/4217 326/93 |
| 5,793,236 A | * | 8/1998 | Kosco | H03K 3/037 327/212 |
| 7,971,088 B2 | * | 6/2011 | Jung | G06F 1/10 713/401 |
| 8,191,029 B2 | * | 5/2012 | Tetelbaum | G06F 17/5031 716/108 |
| 8,433,025 B2 | | 4/2013 | Sun et al. | |
| 8,710,913 B2 | * | 4/2014 | Baumann | G06F 1/305 327/393 |
| 9,041,129 B2 | * | 5/2015 | Ho | H01L 27/2463 257/4 |
| 2014/0232827 A1 | | 8/2014 | Kumar et al. | |

* cited by examiner

*Primary Examiner* — Peguy Jean Pierre
(74) *Attorney, Agent, or Firm* — Eschweiler & Associates, LLC

(57) ABSTRACT

A time to digital converter includes a mutual exclusion element and a sampling component. The mutual exclusion element is configured to receive a first clock and a second clock and to generate a first pulse and a second pulse. The mutual exclusion element is configured to drive the first pulse to a first logic state and the second pulse to a second logic state upon the first clock being earlier than the second clock and drive the second pulse to the first logic state and the first pulse to the second logic state upon the second clock being earlier than the first clock. The sampling component is configured to receive the first pulse and the second pulse and to generate a decision signal according to the first pulse and the second pulse.

19 Claims, 7 Drawing Sheets

100

BANG-BANG TIME TO DIGITAL CONVERTER SYSTEMS AND METHODS

BACKGROUND

A time to digital converter, abbreviated as TDC, is a device for recognizing events and providing a representation of the time they occurred. The TDC can be used to measure an absolute time of an event or to measure a difference or delay between multiple events.

In many systems, such as communication systems, there are multiple paths that need to operate in time. Delays between the paths can degrade communication bandwidth, speed, and reliability. The TDC can be used to determine time delays for the multiple paths. Then, the time delays are used to make adjustments and improve performance of the system.

Typically, a TDC is implemented using gate delays. The analog technology is susceptible to variations such as process, voltage and temperature variations, referred to as PVT variations. These variations impact the operation of the circuitry and can lead to variations in measuring time or delays for multiple paths. Furthermore, these variations limit the resolution or accuracy of such TDCs.

What is needed is a more accurate TDC that is less susceptible to PVT variations and provides a higher resolution.

DETAILED DESCRIPTION

Figure 1:
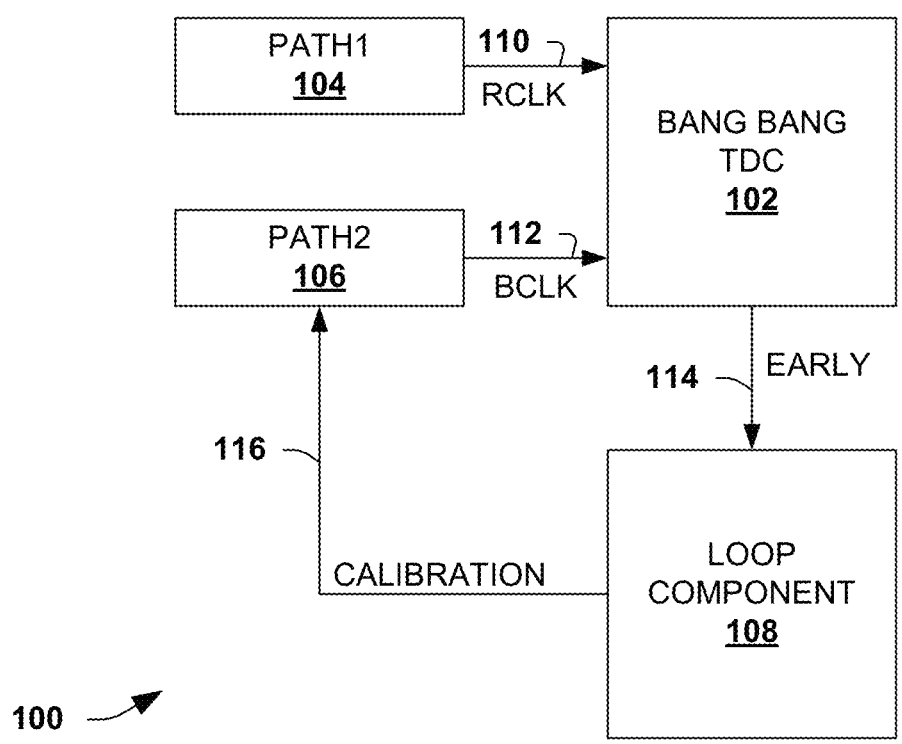
FIG. 1 is a diagram illustrating a digital frequency synthesizer system having a high resolution TDC.

The systems and methods of this disclosure are described with reference to the attached drawing figures, wherein like reference numerals are used to refer to like elements throughout, and wherein the illustrated structures and devices are not necessarily drawn to scale.

Time to digital converters (TDCs) are utilized to recognize events and convey a representation of the events. Communication systems use the measurements to enhance communication.

An issue for communication systems and technology in general is that variations including process, voltage, and temperature (PVT) variations result in performance mismatch and/or variation for analog circuits. As a result, there is a trend to shift towards digital solutions. Generally, digital circuits are not as susceptible to PVT variations as are analog circuits. Thus, analog components are being replaced by digital components. Passive loop filters are being replaced by digital loop filters. Voltage controlled oscillators (VCO) are being replaced by digitally controlled oscillators (DCO). Additionally, phase-frequency detectors (PFD) are being replaced by TDCs and/or bang-bang TDCs.

One difficulty the replacement digital components have is obtaining suitable or comparable jitter performance with their analog counterparts. Jitter is the deviation from true periodicity and can prevent higher resolutions of timing. The reduced jitter performance of the digital replacements negatively impacts performance of the overall system.

Systems and methods are disclosed that include a TDC that can provide sub-picosecond resolution across PVT variations, a large input dynamic range, tolerance to gradient mismatch on dies, ability to compare signals having different frequencies and provide suitable performance without requiring calibration.

FIG. 1 is a diagram illustrating a digital frequency synthesizer system 100 having a high resolution TDC. The system 100 is provided in a simplified form for illustrative purposes only; it is appreciated that components can be added and/or omitted. The system 100 can be utilized within other systems, such as communication systems.

The system 100 includes a TDC 102, a first path 104, a second path 106 and a loop component 108. The TDC 102 is a bang-bang TDC in this example and provides a decision signal 114 based on a first clock 110 and a second clock 112. The first clock 110 is also designated RCLK and the second clock 112 is designated BCLK in FIG. 1. The decision signal 114 indicates which of the clocks 110 and 112 are earlier during a sample period where the first and second clocks 110 and 112 are sampled.

The TDC 102 uses a mutual exclusion element to determine the relative arrival time for the clocks 110 and 112. The TDC 102 makes an early/late decision to determine which clock is first. This determination of first can be based on any transition, a high to low and/or low to high transition.

The first path or chain 104 generates the first clock 110. The second path or chain 106 generates the second clock 112. The first and second paths 104 and 106 have varied properties and delays associated therewith. The varied properties can be due to PVT variations. As a result of the varied properties, the clocks 110 and 112 can have different timing or delays. Furthermore, the clocks 110 and 112 can have similar frequencies or varied frequencies. In one example, the second clock 112 has a frequency 100 times higher than the frequency of the first clock 110.

The first path 104 includes one or more elements of a system, such as a communication system. In one example, the first path 104 includes a power amplifier, a multiplexor, and the like. The second path 106 also includes one or more elements of a system. In one example the second path 106 includes a multiplexor, a multistage adjustable delay element, and the like. The first and/or second paths 104 and 106 can also include a delay adjustment component, such as a delay line, controllable oscillator, one or more delay elements, and the like.

The loop component 108 receives the decision signal 114 and generates a calibration signal 116 in response. The calibration signal 116 is provided to the second path 106, in this example. The calibration signal 116 adjusts the timing for the second path 106 in order to more closely synchronize the first and second clocks 110 and 112. In other examples, the calibration signal 116 and/or other calibration signals are generated to provide time adjustments to other paths, including the first path 104.

The calibration signal 116 is generated based on the decision signal 114. For example, if the decision signal indicates that the second clock 112 is early, then the calibration 116 adds a slight delay to the second path 106. As another example, if the decision signal 114 indicates that the first clock 110 is early (implying that the second clock 112 is late), then the calibration signal 116 removes a slight delay from the second path 106. Alternately, the calibration signal can be used to add a delay to the first path 104.

It is noted that in this example, the TDC 102 does not indicate an amount or period of time between the clocks 110 and 112. However, in other examples, the TDC 102 can include this information.

The loop component 108 can be part of or incorporated with a phase or delay locked loop to facilitate generating an output signal based on the clocks 110 and 112. The component 108 can include other components including, but not limited to, a loop filter, start up/off component, calibration component, lock monitor, low dropout regulator (LDO), and the like. In one example, the loop component 108 is part of a multiplying delay locked loop (MDLL).

Figure 2:
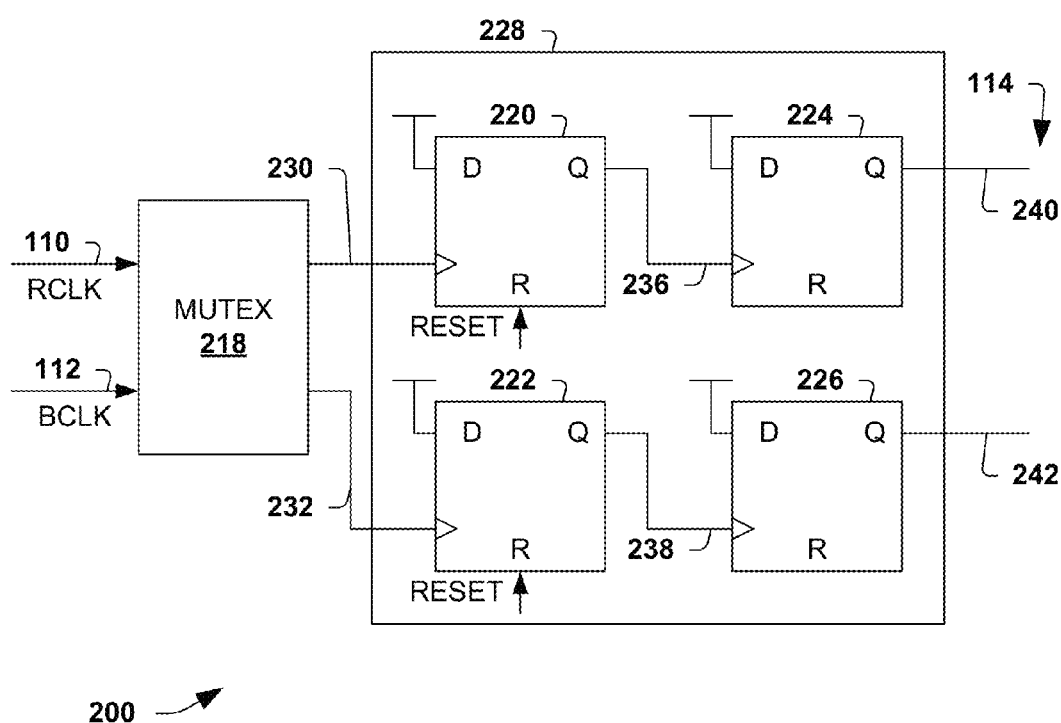
FIG. 2 is a diagram illustrating a high resolution bang-bang time to digital converter (TDC).

FIG. 2 is a diagram illustrating a high resolution bang-bang time to digital converter (TDC) 200. The TDC 200 can be used in system 100 as the TDC 102 and other similar systems to provide a digital indication of arrival times for a plurality of clocks.

The converter 200 includes a mutual exclusion element 218 and a multi-stage component 228. The mutual exclusion element 218 generates first and second pulse signals 230 and 232 based on first and second clocks 110 and 112, respectively. The mutual exclusion element 218 resolves or identifies timing differences between the first and second clocks 110 and 112, instead of calculating a delay between two paths/chains. The mutual exclusion element 218 is fast and can resolve timing differences at sub picosecond timings. The element 218 generates the first pulse 230 based on the first clock 110 and the second clock 112. the second pulse 232 based on the first clock 110 and the second clock 112. Additionally, the mutual exclusion element 218 is configured to drive the second pulse 232 to Low on the first pulse 230 being high and to drive the first pulse 230 low on the second pulse 232 being high.

The sampling component 228 receives the first pulse 230 and the second pulse 232 and generates a decision signal 114 in response. The decision signal 114 is timed for use by other components, such as a DLL. The decision signal 114 includes a first early indicator 240 that indicates if the first clock 110 is before or early in comparison with the second clock 112. The decision signal 114 also includes a second early indicator 242 that indicates if the second clock 112 is before or early in comparison with the first clock 110.

The sampling component 228 includes a first stage of data (D) flip flops and a second stage of D flip flops configured to generate the indicators 240 and 242. The first stage includes flip flops 220 and 222. The second stage includes flip flops 224 and 226. The flip flops have an input D connected to ground and are clocks with an incoming signal. The first stage flip flops also receive a reset signal at a reset input R. It is appreciated that the sampling stage component 228 is shown with a first and second stage in this example, but other suitable number of stages can be used, such as a single stage, multiple stages or a triple stage.

The flip flop 220 is clocked with the first pulse 230 and generates or sets its output Q 236 to high on the first pulse 230 being high. The output signal at Q is referred to as a first lead signal 236. The flip flop 222 is clocked with the second pulse 232 and generates or sets is output Q to high on the second pulse 232 being high. The output at Q is referred to as a second lead signal 238.

The D flip flop 224 receives the first lead signal 236 at its clock input sets its output Q to high on the first lead signal 236 being high. The signal at the output Q is referred to as the first early indicator 240. Generally, if the first early indicator 240 is high, the first clock 110 is determined to be earlier than the second clock 112 during the sampling period.

The D flip flop 226 receives the second lead signal 238 at its clock input and sets its output Q to high on the second lead signal 238 being high. The signal at the output Q is referred to as the second early indicator 242. The second early indicator 242 is high upon the second clock 112 being determined to be earlier than the first clock 110 during the sampling period.

Generally, the sampling component 228 serves to widen the state of the first and second pulse 230 and 232 and provide the decision signal 114 in a suitable format, including pulse duration, for use by other components.

Figure 3:
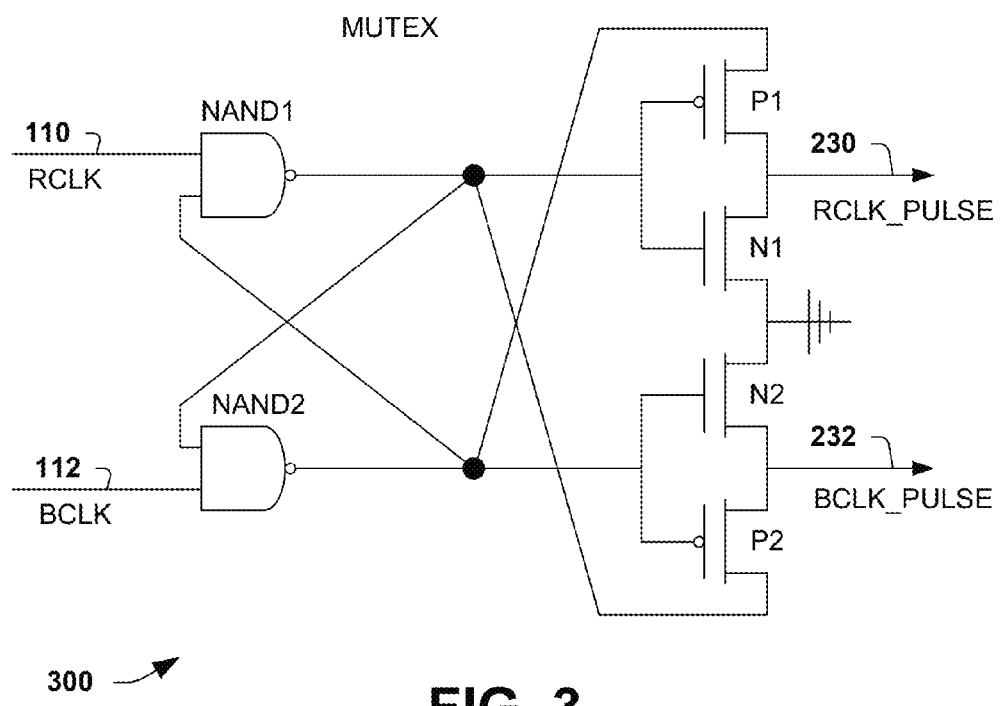
FIG. 3 is a diagram illustrating a mutual exclusion element.

FIG. 3 is a diagram illustrating a mutual exclusion element 300. The element 300 can be used in TDCs, such as the converter 200 described above. The mutual exclusion element 300 can be used as the element 218 in the converter 200.

FIG. 3 provides an example of a suitable configuration for a mutual exclusion element 300. It is appreciated that other suitable configurations can also be employed.

The mutual exclusion element 300 receives multiple clocks and resolves or determines timing differences between them. Additionally, the element 300 resolves or determines relatively small timing differences, such as sub pico second variations.

In this example, the element 300 receives first and second clocks 110 and 112. These clocks can have varied frequencies and/or timings wherein one is generally earlier than the other. The mutual exclusion element 300 resolves or identifies timing differences and generates first and second pulse signals 230 and 232 based on first and second clocks 110 and 112, respectively.

In this example, the first pulse signal 230 is driven high on the first clock 110 being earlier than the second clock 112. Further, the second pulse signal 232 is driven low upon the first clock 110 being earlier than the second clock 112.

The second pulse signal 232 is driven high on the second clock 112 being earlier than the first clock 110. Additionally, the first pulse signal 230 is driven low upon the second clock 112 being earlier than the first clock 110.

The mutual exclusion element 300 includes a NAND stage and a metastabiilty filter. The NAND stage includes a first gate NAND1 and a second gate NAND2. The NAND gates are cross coupled as shown in FIG. 3, wherein an input of one of two inputs is connected to an output of the other gate.

The metastability filter includes a first series of transistors and a second series of transistors. The first series includes a first p-type transistor P1 and a first n-type transistor N1. The transistor P1 has its gate connected the output of the first gate NAND1 and its source connected to the output of the second gate NAND2. The transistor N1 has its gate connected to the output of the first gate NAND1, its source connected to ground and its drain connected to a drain of P1. The coupled drains of P1 and N1 are configured to generate the first pulse signal 230 (RCLK_PULSE).

The second series of transistors includes a second n-type transistor N2 and a second p-type transistor P2. The transistor N2 has its gate connected to the output of the second gate NAND2 and its drain connected to ground. The transistor P2 has its gate connected to the output of the second gate NAND2, its drain connected to the output of the first gate NAND1 and its source connected to the source of the transistor N2. The source of the transistor P2 and the source of the transistor N2 are configured to generate the second pulse signal 232 (BCLK_PULSE).

The NAND gates are configured to drive one of their outputs according to which clock signal 110 or 112 is earlier than the other during a sample period. The filter stage is configured to drive the other of their outputs to an opposite state from the one. For example, if clock 110 is earlier, the output of NAND1 is driven high and is propagated to a first output of the filter stage, the first pulse 230. Continuing the example, a second output of the filter stage, the second pulse 232, is driven to low.

As another example, when the clocks 110 and 112 transition at around the same time, the NAND gates enter a meta stable state. If the first clock 110 arrives earlier than the second clock 112, the first gate NAND1 will respond slightly quicker than the second gate NAND2. As soon as the first pulse 230 toggles high, the filter stage forces the other output, the second pulse 232, to low. If the second clock 112 arrives earlier than the first clock 110, the second gate NAND2 will respond slightly quicker than the first gate NAND1. As soon as the second pulse 232 toggles high, the filter stage forces the other output, the first pulse 230, to low.

Figure 4:
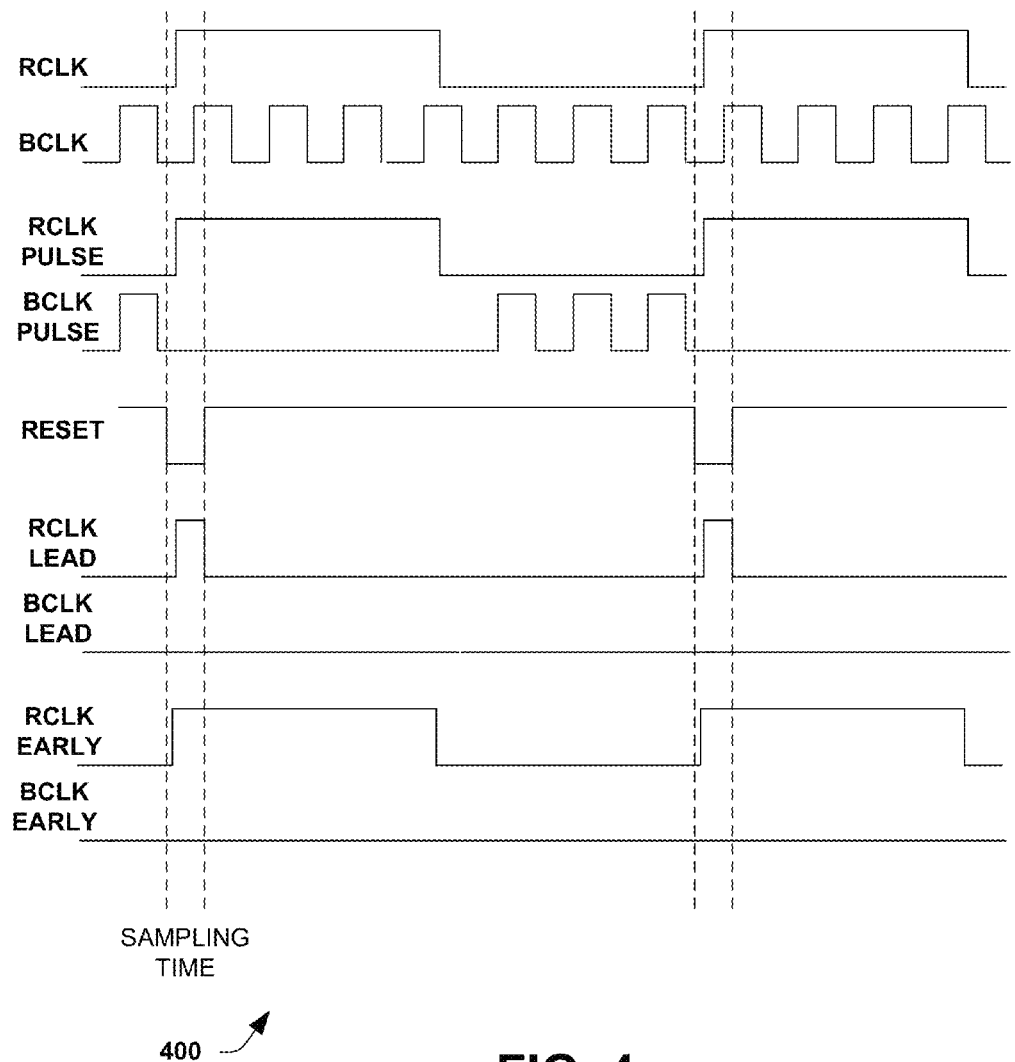
FIG. 4 is a timing diagram where a first clock is earlier than a second clock.
Figure 5:
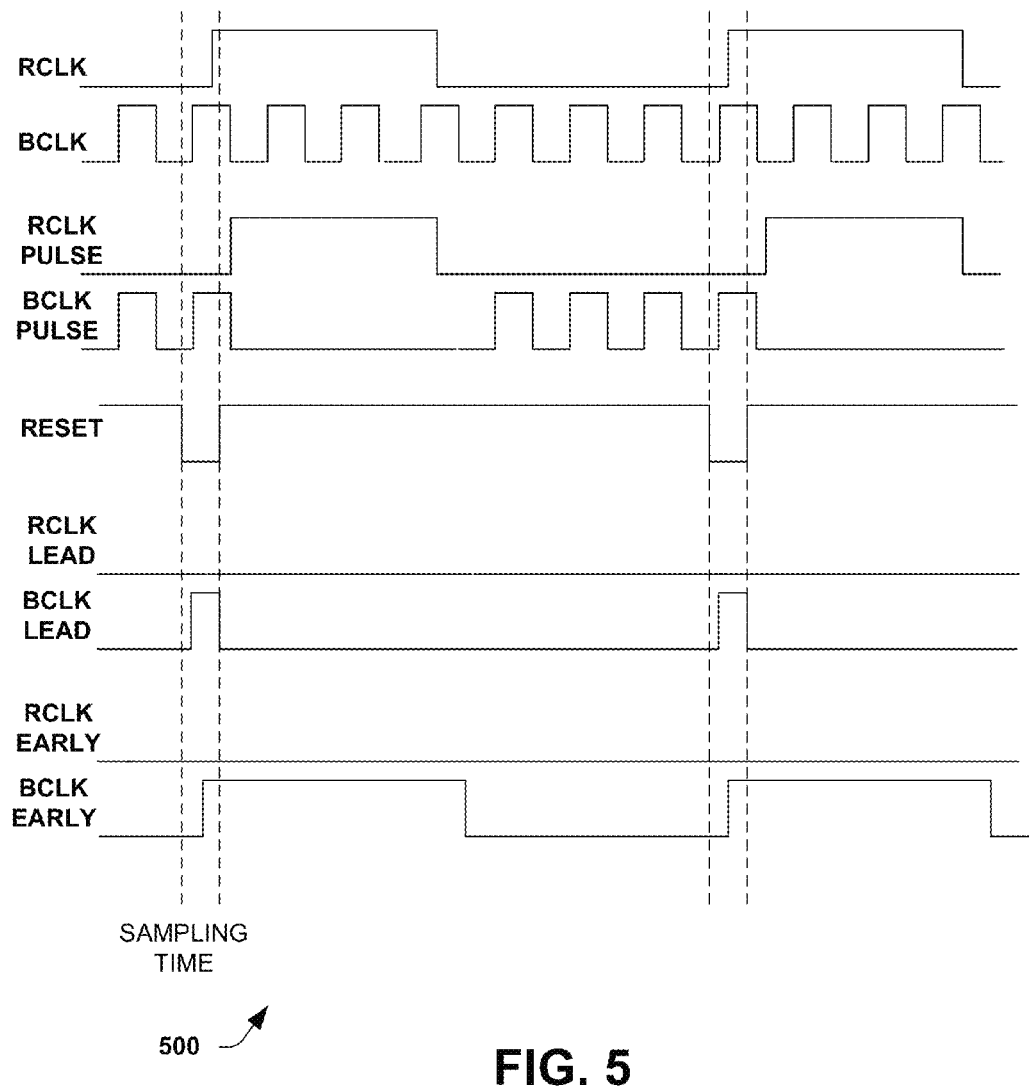
FIG. 5 is a timing diagram where a second clock is earlier than a first clock.

FIGS. 4 and 5 are example timing diagrams of a time to digital converter (TDC). The TDC can be implemented using the converter 200, described above, and variations thereof. The diagrams are described in conjunction with the above systems and are provided for illustrative purposes. It is appreciated that other timings are contemplated.

FIG. 4 is a timing diagram 400 where a first clock is earlier than a second clock. The diagram 400 shows time along an x-axis and logic signal levels corresponding to high or low along a y-axis.

The decision is based on a sampling time or period as shown in the diagram 400. The sampling time is a relatively short period of time. In one example, the sampling time is selected to have a cycle or less of the first and second clocks.

The first clock is designated as RCLK and corresponds to the first clock 110 described above. The second clock is designated BCLK and corresponds to the second clock 112 described above. A first pulse is designated as RCLK_PULSE and corresponds to the first pulse 230 described above. A second pulse signal is designated as BCLK_PULSE and corresponds to the second pulse signal 232 described above. A first lead signal is designated as RCLK_LEAD and corresponds to the first lead signal 236 described above. A second lead signal is designated as BCLK_LEAD and corresponds to the second lead signal 238 described above. A first early indicator is designated by RCLK_EARLY and corresponds to the first early indicator 240 described above. A second early indicator is designated by BCLK_EARLY and corresponds to the second early indicator 242 described above. A reset signal RESET is set low during the sampling time.

In this example, the RCLK is earlier than BCLK in that is transitions from low to high before the BCLK transitions from low to high during the sample time (RESET=low). The RCLK and the BCLK are shown having varied frequencies. In this example, the BCLK has a higher frequency.

In this example, the RCLK is received by the NAND1 gate and the BCLK is received by the NAND2 gate. The RCLK is earlier than the BCLK, thus the NAND1 gate responds and the filter sets the RCLK_PULSE to high while BCLK_PULSE is set to low. The RCLK_PULSE stays high for a period of time, which in this example is until the RCLK transitions from high to low. The RCLK_PULSE and BCLK_PULSE are provided as outputs of the mutual exclusion element.

A sampling component, such as the component 200 described above, receives the BCLK_PULSE and the RCLK_PULSE. A first stage flip flop receives the RCLK_PULSE at its clock input and generates the RCLK_LEAD, which is a delayed version of the RCLK_PULSE. Similarly, another first stage flip flop receives the BCLK_PULSE at its clock input and generates the BCLK_LEAD, a delayed version of the BCLK_PULSE. The RCLK_LEAD signal transitions back to low on the RESET transitioning from low to high. The BCLK_LEAD signal maintains low on the RESET transitioning from low to high.

A first second stage flip flop receives the RCLK_PULSE and generates the RCLK_EARLY. Another second stage flip flop receives the BCLK_PULSE and generates the BCLK_EARLY. The RCLK_EARLY is held high for a suitably long period whereas the BCLK_EARLY is maintained low. Thus, the TDC output, RCLK_EARLY and BCLK_EARLY, can be used to timing decisions and adjustments.

FIG. 5 is a timing diagram 500 where a second clock is earlier than a first clock. The diagram 500 shows time along an x-axis and logic signal levels corresponding to high or low along a y-axis.

The decision is based on a sampling time or period as shown in the diagram 500. The sampling time, again, is a relatively short period of time.

The first clock is designated as RCLK and corresponds to the first clock 110 described above. The second clock is designated BCLK and corresponds to the second clock 112 described above. A first pulse is designated as RCLK_PULSE and corresponds to the first pulse 230 described above. A second pulse signal is designated as BCLK_PULSE and corresponds to the second pulse signal 232 described above. A first lead signal is designated as RCLK_LEAD and corresponds to the first lead signal 236 described above. A second lead signal is designated as BCLK_LEAD and corresponds to the second lead signal 238 described above. A first early indicator is designated by RCLK_EARLY and corresponds to the first early indicator 240 described above. A second early indicator is designated by BCLK_EARLY and corresponds to the second early indicator 242 described above. A reset signal RESET is set low during the sampling time.

In this example, the RCLK is earlier than BCLK in that is transitions from low to high before the BCLK transitions from low to high during the sample time (RESET=low). The RCLK and the BCLK are shown having varied frequencies. In this example, the BCLK has a higher frequency.

In this example, the RCLK is received by the NAND1 gate and the BCLK is received by the NAND2 gate. However, the BCLK is earlier than the RCLK, thus the NAND2 gate responds and the filter sets the BCLK_PULSE to high while RCLK_PULSE is set to low. The BCLK_PULSE stays high for a period of time, which in this example is until the BCLK transitions from high to low. The RCLK_PULSE and BCLK_PULSE are provided as outputs of the mutual exclusion element.

A sampling component, such as the component 200 described above, receives the BCLK_PULSE and the RCLK_PULSE. A first flip flop of a first stage receives the RCLK_PULSE at its clock input and generates the RCLK_LEAD, which is a delayed version of the RCLK_PULSE. Similarly, another first stage flip flop receives the BCLK_PULSE at its clock input and generates the BCLK_LEAD, a delayed version of the BCLK_PULSE. The BCLK_LEAD signal transitions back to low as shown. The RCLK_LEAD signal maintains low on the RESET transitioning from low to high.

A first second stage flip flop receives the RCLK_PULSE and generates the RCLK_EARLY. Another second stage flip flop receives the BCLK_PULSE and generates the BCLK_EARLY. The BCLK_EARLY is held high for a suitably long period whereas the RCLK_EARLY is maintained low. Thus, the TDC output signals, RCLK_EARLY and BCLK_EARLY, are provided with suitable timing so they can be used for timing decisions and adjustments.

Figure 6:
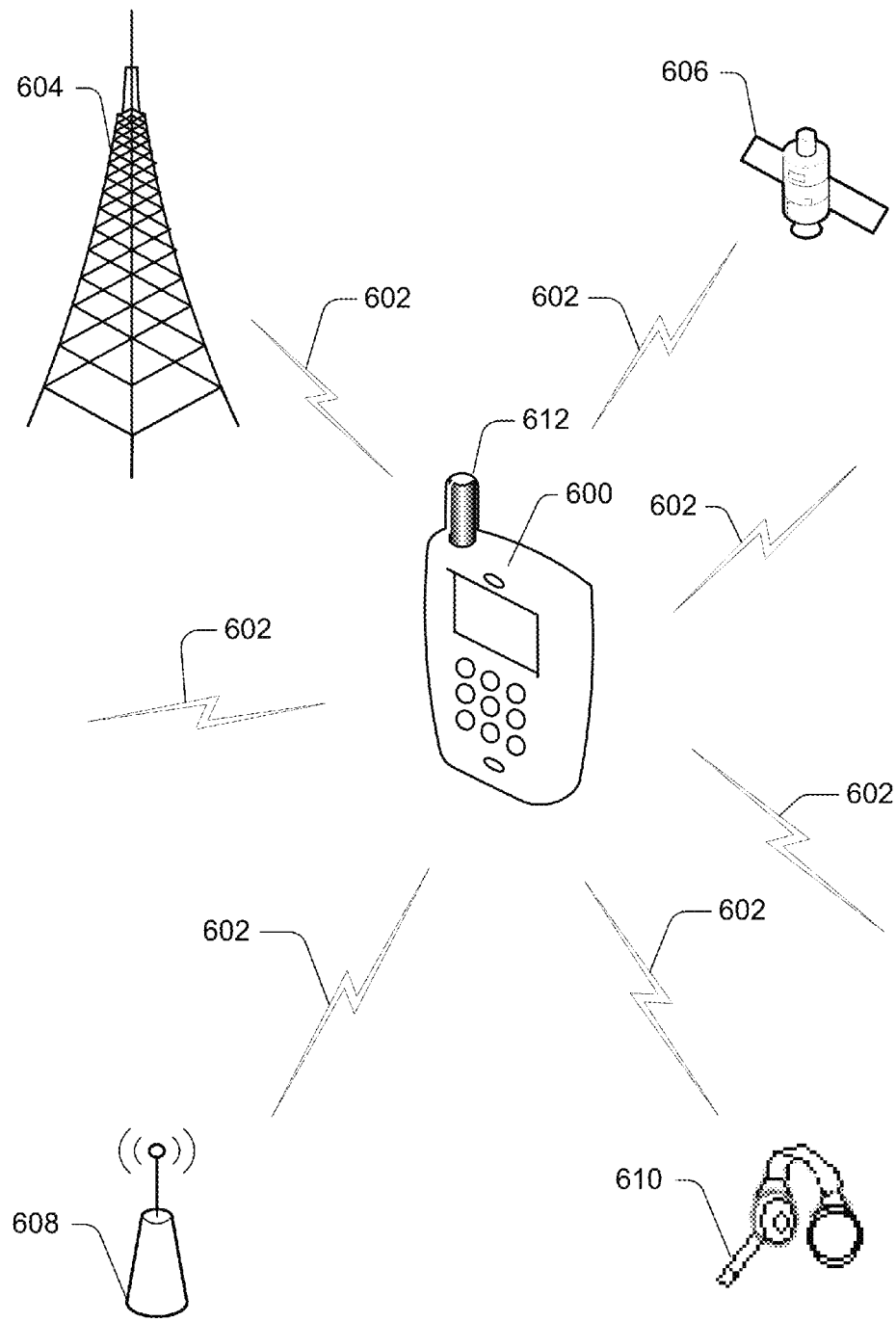
FIG. 6 is a diagram of an example wireless device that is operable to send and receive signals using a communication system having a bang-bang time to digital converter.

FIG. 6 is a diagram of an example wireless device 600 that is operable to send and receive signals using a communication system having a bang-bang time to digital converter. The device 600 utilizes communication technologies, e.g., GSM, UMTS, and so forth, for communication with communications points such as a base station 604, a satellite 606, a wireless access point (WAP) 608, Bluetooth (BT) headset 610, and/or other commutation devices through the use of wireless signals 602, which may be, for example, radio signals.

The wireless device 600 may be cellular phone, wireless media device, or other device capable of receiving and/or transmitting a radio or other wireless signal 602. For example, the wireless device 600 may be a personal digital assistant (PDA), a portable computing device capable of wireless communication, a media player device, a portable gaming device, a personal computer, a wireless access point (WAP) and/or any other suitable device.

The device 600 includes a digital frequency synthesizer for communication. The digital frequency synthesizer includes a high resolution TDC, such as the ones described above in FIGS. 1, 2 and 3.

The wireless device 600 includes one or more antennas 612 that may be configured for communication with the base station 604, satellite 606, WAP 108, BT headset 610, and so forth. For example, the wireless device 600 may communicate using a GSM or UMTS technology with the base station 604 as part of a cellular network, in which the base station 602 represents a cellular phone tower or other device capable of transmitting and/or receiving one or more radio or other wireless signals 602 within a cell of a cellular network. The wireless device 600 may also communicate with the BT headset 110 using a BT mode for transmitting and receiving. The wireless device 600 may additionally or alternatively communicate with other communication points using one or more antennas 612, which may be configured as a multimode (MM)/multiple-input multiple-output (MIMO)/multiple-input single-output (MISO), and/or single-input multiple-output (SIMO) system to transmit and/or receive one or more signals 602 in one or more modes.

Figure 7:
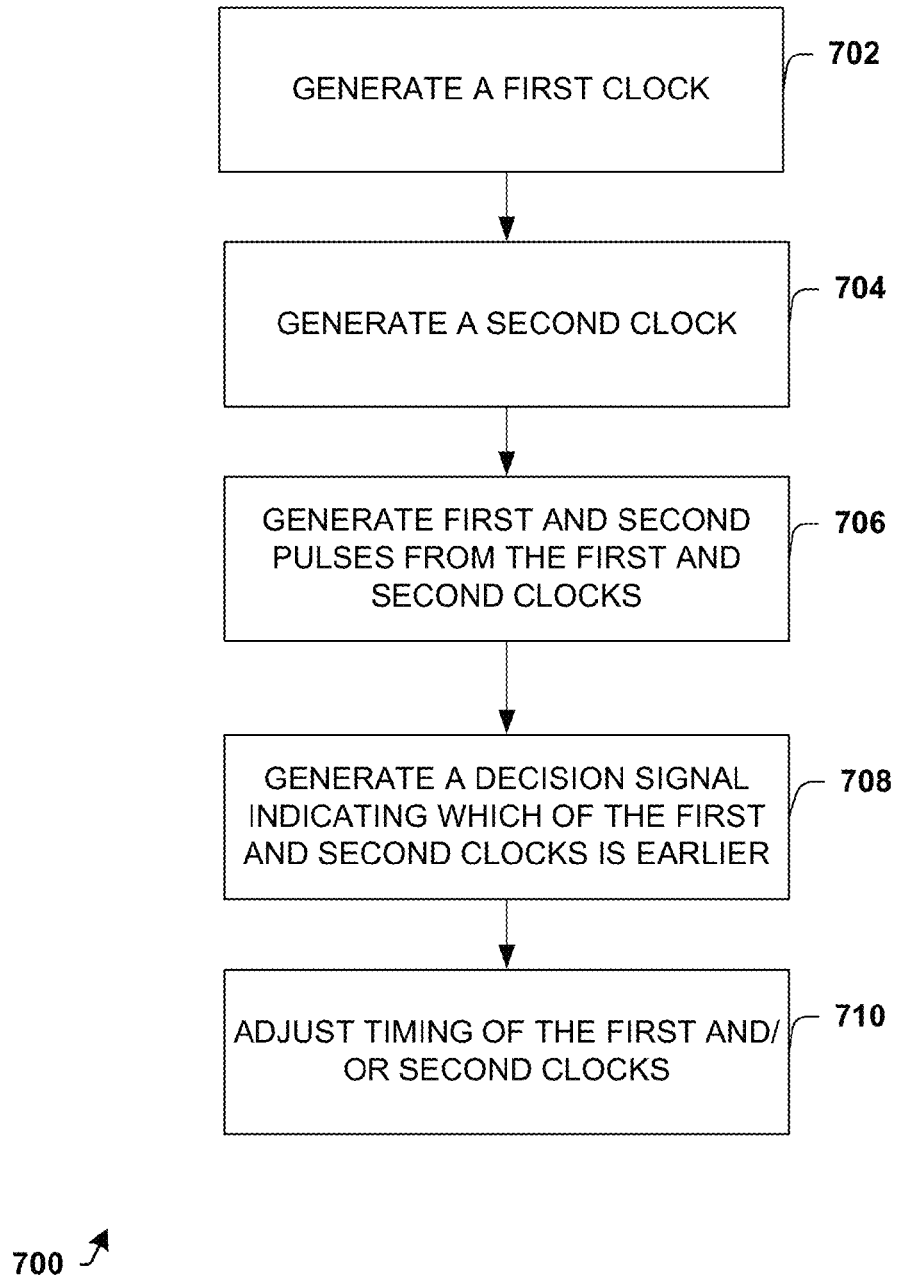
FIG. 7 is a flow diagram illustrating a method of generating a timing decision signal.

FIG. 7 is a flow diagram illustrating a method 700 of generating a timing decision signal. The method 700 utilizes a mutually exclusive element to resolve timing differences between multiple clocks. Additionally, the timing differences are resolved or identified without substantial impact from PVT variations and with a relatively high resolution.

A first path generates a first clock signal at block 702. The first path has properties, including a delay, that are at least partially due to PVT variations that impact the first clock signal. The first path can include one or more elements, such as, a power amplifier, multiplexor, adjustable delay element, and the like.

A second path generates a second clock signal at block 704. The second path also has properties, including a delay, that are at least partially due to PVT variations that impact the second clock signal. The second path can include one or more elements, such as a power amplifier, multiplexor, adjustable delay element, and the like. The second clock signal also has a second frequency that can be varied from the first frequency of the first clock signal.

A mutual exclusion element generates a first pulse and a second pulse from the first clock and the second clock at block 706. The first pulse and the second pulse are generated to be mutually exclusive in that one is set to high while the other is set to low. The mutual exclusion element, in one example, includes a pair of cross coupled NAND gates that receive the first and second clock and generate the first and second pulse as high or low according to which clock transitions earlier during a sample period/time.

A sampling component generates a decision signal at block 708. The decision signal indicates one of the first and second clocks as being earlier than the other. The decision signal is typically in digital format, but can also include an amount of delay. In one example, the decision signal includes a first early signal that is set to a high state on the first clock being earlier and a second early signal that is set to a high state on the second clock being earlier than the first clock.

A component adjusts a timing of at least one of the first and second clocks based on the decision signal at block 710. The component, such as the loop component 108 described above, determines and generates a calibration based on the decision signal. As described above, the decision signal identifies one of the clocks as being earlier than the other. In response, the component generates the calibration that adjusts the timing. Thus in one example, if the decision signal indicates that the first clock is earlier, than the component generates a calibration to adjust a delay of the second clock to be earlier. Additionally, the calibration includes an amount of delay adjustment. This amount can be predetermined and the method 700 may repeat a number of times in order to substantially reduce timing variations between the first and second clocks.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

Examples may include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a time to digital converter that includes a mutual exclusion element and a sampling component. The mutual exclusion element is configured to receive a first clock and a second clock and to generate a first pulse and a second pulse. The mutual exclusion element is configured to drive the first pulse to a first logic state and the second pulse to a second logic state upon the first clock being earlier than the second clock and drive the second pulse to the first logic state and the first pulse to the second logic state upon the second clock being earlier than the first clock. The sampling component is configured to receive the first pulse and the second pulse and to generate a decision signal according to the first pulse and the second pulse.

Example 2 includes the subject matter of claim 1, where the converter further includes a component configured to adjust timing of at least one of the first clock and the second clock according to the decisions signal.

Example 3 includes the subject matter of any of Examples 1 and 2, including or omitting optional elements, where the converter further includes a first path configured to generate the first clock having a first delay and a second path configured to generate the second clock having a second delay.

Example 4 includes the subject matter of any of Examples 1-3, including or omitting optional elements, where the decision signal includes a first early indicator and a second early indicator. The first early indicator is set to the first logic state upon the first clock being earlier than the second clock and the second early indicator is set to the first logic state upon the second clock being earlier than the first clock.

Example 5 includes the subject matter of any of Examples 1-4, including or omitting optional elements, where the decision signal has relaxed timing.

Example 6 includes the subject matter of any of Examples 1-5, including or omitting optional elements, where the first clock and the second clock have different frequencies.

Example 7 includes the subject matter of any of Examples 1-6, including or omitting optional elements, where the first clock has a frequency at least 10 times greater than a frequency of the second clock.

Example 8 includes the subject matter of any of Examples 1-7, including or omitting optional elements, where the mutual exclusion element is configured to generate the first pulse and the second pulse based on a selected sample period.

Example 9 includes the subject matter of any of Examples 1-8, including or omitting optional elements, where the mutual exclusion element includes cross coupled NAND gates and a metastability filter coupled to the cross coupled NAND gates.

Example 10 includes the subject matter of any of Examples 1-9, including or omitting optional elements, where an output of a first NAND gate is driven to the first state and an output of a second NAND gate is driven to the second state upon the first clock being earlier than the second clock.

Example 11 includes the subject matter of any of Examples 1-10, including or omitting optional elements, where the sampling component is configured to widen the states from the first pulse and the second pulse into the decision signal.

Example 12 includes the subject matter of any of Examples 1-11, including or omitting optional elements, where the sampling component includes a first stage of delay flops and a second stage of delay flops.

Example 13 is a digital frequency system that includes a first path, a second path, a time to digital converter and a loop component. The first path has a first delay and is configured to generate a first clock having a first frequency. The second path has a second delay and is configured to generate a second clock having a second frequency. The time to digital converter is configured to generate a decision signal based on the first clock and the second clock. The decision signal indicates which clock is earlier. The loop component is configured to receive the decision signal and generate a calibration signal based on the decision signal.

Example 14 includes the subject matter of any of Examples 13, including or omitting optional elements, where the second path is configured to adjust the second clock according to the calibration signal.

Example 15 includes the subject matter of any one of Examples 13-14, including or omitting optional elements, where the first path and the second path are configured to adjust the first clock and the second clock according to the calibration signal.

Example 16 includes the subject matter of any one of Examples 13-15, including or omitting optional elements, where the loop component includes a loop filter and a low dropout regulator.

Example 17 includes the subject matter of any one of Examples 13-16, including or omitting optional elements, where the loop component is a multiplying delay locked loop.

Example 18 includes the subject matter of any one of Examples 13-17, including or omitting optional elements, where the first path includes a controllable oscillator configured to adjust the first delay of the first path.

Example 19 includes the subject matter of any one of Examples 13-18, including or omitting optional elements, where the second path includes a delay line configured to adjust the second delay of the second path.

Example 20 is a method of generating a timing decision signal. A first clock signal is generated by a first path. A second clock signal is generated by a second path. A first pulse and a second pulse are generated by a mutual exclusion element. The first pulse is set to a first logic state upon the first clock signal being earlier. The second pulse is set to the first logic state upon the second clock signal being earlier. A decision signal is generated by a sampling component indicating which of the first and second clocks is earlier based on the first pulse and the second pulse.

Example 21 includes the subject matter of Example 20, including, where a timing of the second clock signal is adjusted based on the decision signal.

Example 22 includes the subject matter of any of Examples 20-21, where the decision signal includes a first indicator set to the first state upon the first clock being earlier and a second indicator set to the first state upon the second clock being earlier.

Example 23 includes the subject matter of any of Examples 20-22, further including generating the second clock signal includes generating the second clock signal to have a different frequency than the first clock signal.

Example 24 is a system having a means for generating a first clock signal, a means for generating a second clock signal, a means for generating a first pulse and a second pulse, and a means for generating a decision signal based on the first pulse and the second pulse. The first pulse is set to a first logic state upon the first clock signal being earlier than the second clock signal and the second pulse is set to the first logic state upon the second clock signal being earlier than the first clock signal.

Example 25 includes the subject matter of Examples 24, including or omitting optional elements, where the system further includes a means for adjusting a timing of at least one of the first clock signal and the second clock signal based on the decision signal.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well.

Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. The component or structure includes a processor executing instructions in order to perform at least portions of the various functions. In addition, while a particular feature of the invention may have been disclosed with respect to only one of several implementations, such feature may be combined with one or more other features of the other implementations as may be desired and advantageous for any given or particular application.

Furthermore, to the extent that the terms "including", "includes", "having", "has", "with", or variants thereof are used in either the detailed description and the claims, such terms are intended to be inclusive in a manner similar to the term "comprising".

What is claimed is:

1. A time to digital converter comprising:
   a mutual exclusion element configured to receive a first clock and a second clock and to generate a first pulse and a second pulse, wherein the mutual exclusion element is configured to drive the first pulse to a first logic state and the second pulse to a second logic state upon the first clock being earlier than the second clock and drive the second pulse to the first logic state and the first pulse to the second logic state upon the second clock being earlier than the first clock; and
   a sampling component configured to receive the first pulse and the second pulse and to generate a decision signal according to the first pulse and the second pulse,
   wherein the decision signal includes a first early indicator and a second early indicator, wherein the first early indicator is set to the first logic state upon the first clock being earlier than the second clock and the second early indicator is set to the first logic state upon the second clock being earlier than the first clock.

2. The converter of claim 1, further comprising a component configured to adjust timing of at least one of the first clock and the second clock according to the decision signal.

3. The converter of claim 1, further comprising a first path configured to generate the first clock having a first delay and a second path configured to generate the second clock having a second delay.

4. The converter of claim 1, wherein the decision signal has relaxed timing.

5. The converter of claim 1, wherein the first clock and the second clock have different frequencies.

6. The converter of claim 1, wherein the first clock has a frequency at least 10 times greater than a frequency of the second clock.

7. The converter of claim 1, wherein the mutual exclusion element is configured to generate the first pulse and the second pulse based on a selected sample period.

8. The converter of claim 1, wherein the sampling component is configured to widen the states from the first pulse and the second pulse into the decision signal.

9. A time to digital converter comprising:
   a mutual exclusion element configured to receive a first clock and a second clock and to generate a first pulse and a second pulse, wherein the mutual exclusion element is configured to drive the first pulse to a first logic state and the second pulse to a second logic state upon the first clock being earlier than the second clock and drive the second pulse to the first logic state and the first pulse to the second logic state upon the second clock being earlier than the first clock; and
   a sampling component configured to receive the first pulse and the second pulse and to generate a decision signal according to the first pulse and the second pulse,
   wherein the mutual exclusion element includes cross coupled NAND gates and a metastability filter coupled to the cross coupled NAND gates.

10. The converter of claim 9, wherein an output of a first NAND gate is driven to the first state and an output of a second NAND gate is driven to the second state upon the first clock being earlier than the second clock.

11. A time to digital converter comprising:
    a mutual exclusion element configured to receive a first clock and a second clock and to generate a first pulse and a second pulse, wherein the mutual exclusion element is configured to drive the first pulse to a first logic state and the second pulse to a second logic state upon the first clock being earlier than the second clock and drive the second pulse to the first logic state and the first pulse to the second logic state upon the second clock being earlier than the first clock; and
    a sampling component configured to receive the first pulse and the second pulse and to generate a decision signal according to the first pulse and the second pulse,
    wherein the sampling component includes a first stage of delay flops and a second stage of delay flops.

12. A digital frequency system comprising:
    a first path having a first delay and configured to generate a first clock, the first clock having a first frequency;
    a second path having a second delay and configured to generate a second clock, the second clock having a second frequency;
    a time to digital converter configured to generate a decision signal based on the first clock and the second clock, wherein the decision signal indicates which of the first clock and the second clock is earlier; and
    a loop component configured to receive the decision signal and generate a calibration signal based on the decision signal.

13. The system of claim 12, wherein the second path is configured to adjust the second clock according to the calibration signal.

14. The system of claim 12, wherein the first path and the second path are configured to adjust the first clock and the second clock according to the calibration signal.

15. The system of claim 12, wherein the loop component includes a loop filter and a low dropout regulator.

16. The system of claim 12, wherein the loop component is a multiplying delay locked loop.

17. A method of generating a timing decision signal, the method comprising:
    generating a first clock signal by a first path;
    generating a second clock signal by a second path;
    generating a first pulse and a second pulse by a mutual exclusion element, wherein the first pulse is set to a first logic state upon the first clock signal being earlier and the second pulse is set to the first logic state upon the second clock signal being earlier; and
    generating a decision signal by a sampling component indicating which of the first and second clocks is earlier based on the first pulse and the second pulse.

18. The method of claim 17, further comprising adjusting a timing of the second clock signal based on the decision signal.

19. The method of claim 17, wherein the decision signal includes a first indicator set to the first state upon the first clock being earlier and a second indicator set to the first state upon the second clock being earlier.

* * * * *